United States Patent [19]

Fuyama et al.

[11] Patent Number: 4,543,573
[45] Date of Patent: Sep. 24, 1985

[54] DISPLAY PANEL

[75] Inventors: Moriaki Fuyama; Katsumi Tamura; Makoto Morijiri; Mamoru Sawahata; Hiroaki Hachino, all of Hitachi, Japan

[73] Assignee: Hitachi, Ltd., Tokyo, Japan

[21] Appl. No.: 363,458

[22] Filed: Mar. 30, 1982

[30] Foreign Application Priority Data

Mar. 31, 1981 [JP] Japan .................................. 56-46504

[51] Int. Cl.⁴ ............................................... G09G 3/00
[52] U.S. Cl. ..................... 340/781; 340/784; 340/719; 350/334; 357/71
[58] Field of Search ............... 340/781, 784, 718, 719; 350/334, 335, 336; 357/71

[56] References Cited

U.S. PATENT DOCUMENTS

| | | | |
|---|---|---|---|
| 3,483,610 | 12/1969 | Campo | 357/71 X |
| 4,231,640 | 11/1980 | Funada et al. | 350/336 |
| 4,335,937 | 6/1982 | Takamatsu et al. | 350/336 |
| 4,362,903 | 12/1982 | Eichelburger et al. | 350/336 X |
| 4,385,976 | 5/1983 | Schuster-Wolden et al. | 350/336 X |

Primary Examiner—Marshall M. Curtis
Assistant Examiner—Vincent P. Kovalick
Attorney, Agent, or Firm—Antonelli, Terry & Wands

[57] ABSTRACT

A display panel includes a pair of substrates arranged face to face with each other with a predetermined gap therebetween, at least a pair of electrodes each provided on a corresponding one of facing surfaces of the substrates, and a display substance provided between the electrodes. A picture element is made up of a pair of facing portions of the electrodes and a portion of the display substance situated between the facing portions. At least one of the electrodes is made up of a multiplicity of picture element electrodes formed of a transparent conductive film and juxtaposed to each other and a contact metal member for substantially making an electrical connection of a plurality of ones of the picture element electrodes. The contact metal member is made up of a first layer made of chromium or a chromium alloy and a second layer formed on the first layer and made of nickel or gold.

11 Claims, 17 Drawing Figures

DISPLAY PANEL

The present invention relates to display panels such as a liquid crystal display panel and a plasma display panel.

In display panels, there are used a great variety of display substances which include a liquid crystal material, an electroluminescence material, a plasma display material, and others. A liquid crystal display panel is shown in FIG. 1 of the accompanying drawings, as an example of various display panels. Referring to FIG. 1, a pair of substrates 1 and 2 each having an electrode 5 are disposed with a gap of 5 to 10 $\mu$m therebetween. A liquid crystal material is introduced into the gap to form a liquid crystal layer 3, and the peripheral portion of the gap is sealed with a sealing agent 4. In this case, each of the substrates 1 and 2 is usually made of glass or a plastic material, and a row electrode and a column electrode are formed on one and the other of the facing surfaces of the substrates, respectively.

In recent years, display devices have been greatly advanced, and it is required to display a great number of characters and pictures on a large panel. In order to satisfy this requirement, a method is used in which a row electrode pattern and a column electrode pattern are made fine to increase the number of picture elements each made up of the row and column electrodes and a display substance (namely, a liquid crystal material) situated therebetween. Further, in order to carry out this method in a satisfactory manner, there is employed a multi-matrix structure that one column electrode is divided into a number of picture element electrodes and one row electrode corresponds to picture element electrodes on a plurality of rows. Please refer to, for example, U.S. Pat. No. 4,233,602 and German patent Laid-open No. 2,620,530. In this structure, however, since a transparent conductive film for forming the picture element electrodes has a high electric resistivity, when a fine electrode pattern is made large in length, an image at that part of the electrode pattern which is apart from a connecting portion connected to an external circuit, becomes dark, or a picture element at such a part may not light up. Thus, irregularities in connection with display are generated, and therefore the picture quality is deteriorated.

In order to solve this problem, the abovementioned German patent Laid-open No. 2,620,530 discloses that a metal contact member of such a low-resistivity material as gold, aluminum or copper is formed on the transparent conductive film. However, the material for forming the metal contact member is required to have high workability in addition to the low resistivity, so that a fine pattern can be formed. Further, it is required that the metal contact member can be connected with en external circuit without arousing any trouble.

In other words, the metal contact member necessary to form a display panel having a multi-matrix structure is required to satisfy the following conditions, in addition to that the metal contact member has a low electric resistance. (1) The metal contact member can be readily photoetched, and can have a desired pattern with high accuracy. (2) The metal contact member adheres well to the substrate and the transparent conductive film. (3) A connecting terminal portion of the metal contact member can be readily and firmly connected to an electric circuit with solder. (4) The metal contact member is high in chemical stability. (5) The metal contact member is low in cost, in addition to that the conditions (1) to (4) are satisfied as much as possible.

It can be readily understood from these conditions how important the material and construction of the metal contact member are in fabricating a display panel having a multi-matrix structure.

The present inventors have studied the metal contact member from various viewpoints, and have invented a structure of display panel which can satisfy the above-mentioned conditions. The results of the study will be explained below in detail.

Needless to say, it is desirable that the metal contact member formed of a single-layer film has a low resistance and can satisfy the above-mentioned conditions. Such metals as aluminum, gold, silver, copper, nickel and chromium have been used to make the single-layer film, as described in, for example, the German patent Laid-open No. 2620530. However, it has been found that the single-layer film made of one of these metals has the following drawbacks.

A single-layer film made of aluminum can be formed with a pattern with high accuracy, is readily soldered, and adheres well to a transparent conductive film (made of $In_2O_3$ and/or $SnO_2$). However, the transparent conductive film is reduced by hydrogen which is generated in etching the aluminum film, and thus pinholes are produced in the transparent conductive film. Further, after the single-layer film of aluminum has been formed, a fraction of oxygen in the transparent conductive film reacts with aluminum, and thus a swelling is produced in the aluminum pattern. Therefore, the single-layer film made of aluminum is undesirable.

Further, a single-layer film made of any one of gold, silver and copper does not react with the transparent conductive film, but adheres poorly with the substrate and the transparent conductive film. Accordingly, the single-layer film readily peels. In addition, a single-layer film made of gold is easily attacked by solder at the connecting terminal thereof, and therefore it is impossible to connect the film and an external circuit with solder.

Further, a single-layer film made of nickel can be etched with high accuracy in forming a fine pattern and is soldered relatively easily, but adheres to the substrate in an unsatisfactory manner. In addition, the soldered joint between the connecting terminal portion of the nickel film and an electric circuit is low in strength, and therefore the connecting terminal portion often peels.

Further, in addition to the fact that chromium is high in resistivity as compared with the above-mentioned metals, a single-layer film made of chromium gets wet poorly with solder, though the film adheres very well with the substrate and the transparent conductive film. Accordingly, it is impossible to connect the chromium film and an electric circuit with solder.

It has been made clear from the above-mentioned facts that a metal contact member formed of a singlelayer metal film cannot be used in making a multi-matrix structure.

An object of the present invention is to provide a display panel which can eliminate the drawbacks of the prior art and is provided with an electrode capable of satisfying the above-mentioned conditions (1) to (5) required for an electrode of a matrix liquid crystal display panel.

In order to attain the above object, according to the present invention, there is provided a display panel which includes a pair of substrates arranged face to face with each other with a predetermined gap therebetween, at least a pair of electrodes each provided on a corresponding one of facing surfaces of the substrates, and a display substance provided between the electrodes, and in which a picture element is made up of a pair of facing portions of the electrodes and a portion of the display substance situated between the facing portions, at least one of the electrodes is made up of a multiplicity of picture element electrodes formed of a transparent conductive film and juxtaposed to each other and a contact metal member for substantially making an electrical connection of a plurality of ones of the picture element electrodes, and the contact metal member is made up of a first layer made of chromium or a chromium alloy and a second layer formed on the first layer and made of nickel or gold.

The other objects, features and advantages of the present invention will become apparent from the following detailed description of embodiments taken in conjunction with the accompanying drawings, in which:

FIG. 2b is a sectional view taken along the line IIB—IIB in FIG. 2a;

FIG. 2c is an enlarged plan view showing the part IIC of the substrate 12 shown in FIG. 2a;

Figure 1:
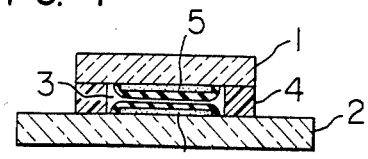
FIG. 1 is a schematic view for explaining a fundamental structure of a liquid crystal display panel.
Figure 2A:
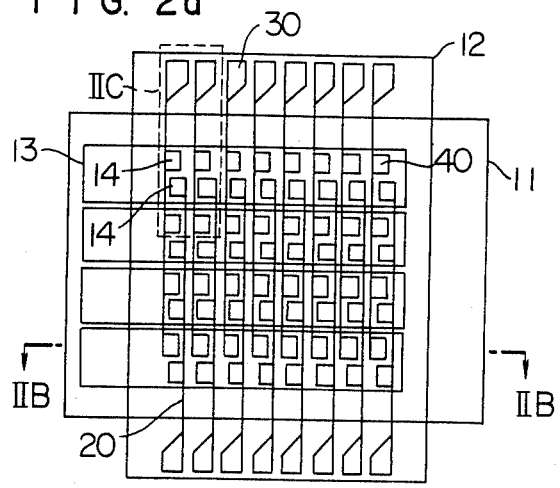
FIG. 2a is a plan view showing an embodiment of a double matrix liquid crystal display panel, to which the present invention is applicable.
Figure 2B:
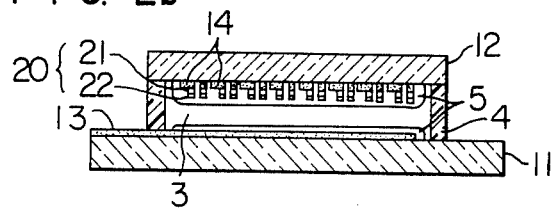

First, a structure of a display panel according to the present invention will be explained below in detail, with reference to FIGS. 2a to 2e. FIG. 2a is a plan view of a display panel according to the present invention, FIG. 2b a sectional view taken along the line IIB—IIB in FIG. 2a, FIG. 2c an enlarged plan view showing the part IIC of the substrate 12 shown in FIG. 2a, FIG. 2d a sectional view taken along the line IID—IID in FIG. 2c, and FIG. 2e a sectional view taken along the line IIE—IIE in FIG. 2c.

In FIGS. 2a to 2e, reference numerals 11 and 12 designate a pair of transparent insulating substrates made of glass, a plastic material or the like for forming a double matrix display panel, 13 and 14 transparent conductive films provided on the substrates 11 and 12 and made of $In_2O_3$, $SnO_2$, a mixture of $In_2O_3$ and $SnO_2$ or the like and 20 a metal contact member provided on a portion of the transparent conductive film 14 which does not correspond to picture elements 40. The metal contact member 20 is formed of a first layer 21 which is made of chromium or a chromium alloy, and a second layer 22 which is provided on the first layer 21 and made of nickel or gold. A connecting terminal portion 30 to be connected to an external circuit is larger in area than other portions of the metal contact member 20, and has a structure that a third layer 23 made of copper is provided on the second layer 22. Further, reference numeral 3 designates a liquid crystal material introduced into a uniform gap (of, for example, 10 μm) between the substrates 11 and 12, 4 a sealing agent, and 5 an orientation film for the liquid crystal material 3. The orientation film 5 is omitted in FIGS. 2d and 2e for the sake of brevity. One picture element 40 is made up of a pair of facing portions of the transparent conductive films 13 and 14 and a portion of the liquid crystal material situated between the facing portions.

Figure 2C:
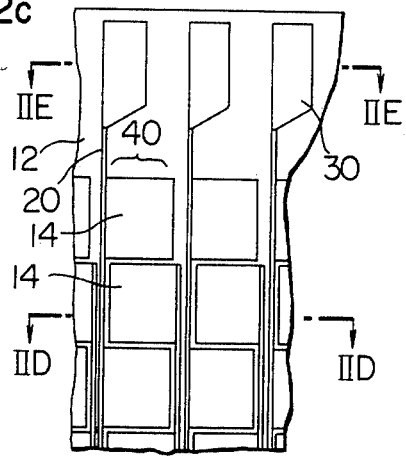
Figure 3:
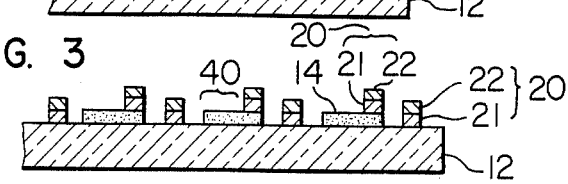
FIG. 3 is another example of the sectional view taken along the line IID—IID in FIG. 2c.

Further, the present invention is also applicable to the case where the above-mentioned display panel has such a structure as shown in FIG. 3 in place of the structure shown in FIG. 2c, that is, to the case where the transparent conductive film 14 does not exist at a place beneath a portion of the metal contact member 20 for connecting picture elements 40, and therefore this portion of the metal contact member 20 is disposed directly on the substrate 12.

Now, various embodiments of a display panel according to the present invention will be explained on the basis of the above-mentioned structures.

EMBODIMENT 1

Figure 4A:
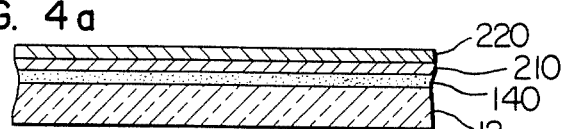
FIGS. 4a to 4h are views for showing a fabricating process of an embodiment 1 of a display panel according to the present invention.

A process for fabricating the present embodiment will be first described with reference to FIGS. 4a to 4h. Referring to FIG. 4a, an $In_2O_3$ film 140 forming a transparent conductive film is deposited through an evaporation technique, to a thickness of 400 to 500 Å, on the transparent insulating substrate 12 which is formed of a glass plate, a plastic film, or the like and has been made clean, and successively a chromium film 210 and a nickel film 220 are deposited through a vacuum evaporation technique and a sputtering technique to form a laminate. It is preferable to successively carry out the above-mentioned steps in the same vacuum evaporation device.

Figure 4B:
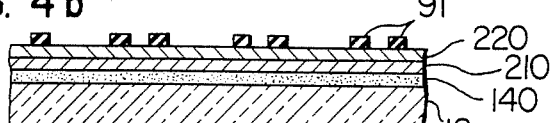

Next, a first photoresist pattern 91 having the same shape as the metal contact member 20 shown in FIG. 2c is formed, as shown in FIG. 4b.

Figure 4C:
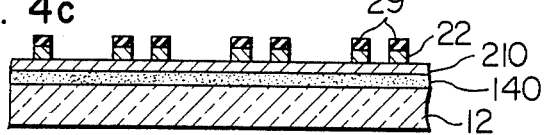

Then, the nickel film 220 is chemically etched by using the first photoresist pattern 91 as a mask. This etching is carried out at an etching rate of 22 nm/sec using an etching solution at 25° C. containing ten volumes of $HNO_3$ and one volume of $H_2O_2$, or at an etching rate of 8 nm/sec using an etching solution at 25° C. containing five volumes of $CH_3COOH$, three volumes of $HNO_3$, one volume of $H_3PO_4$ and one volume of $H_2SO_4$. Thus, a nickel pattern 22 having the same shape as the metal contact member 20 shown in FIG. 2c is obtained, as shown in FIG. 4c. These etching solutions produce only a little undercut in the nickel pattern 22.

Figure 4D:
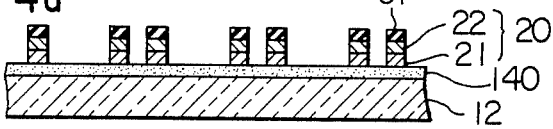

Next, the chromium film 210 is chemically etched at an etching rate of 6.5 nm/sec by using a 25 percent solution of $Ce(NO_3)_2.2NH_4NO_3$ as an etching solution at 25° C. Thus, a chromium pattern 21 having the same shape as the metal contact member 20 shown in FIG. 2c is obtained, as shown in FIG. 4d. This etching solution produces only a little undercut in the chromium pattern 21, and selectively etches the chromium film 210 without etching the nickel pattern 22 and $In_2O_3$ film 140.

Figure 4E:
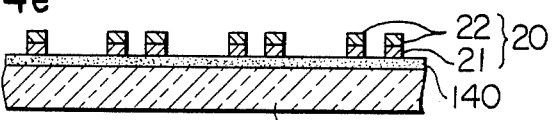

Next, the first photoresist pattern 91 is peeled off by a photoresist removing agent belonging to the xylene group, or the like, as shown in FIG. 4e.

Figure 4F:
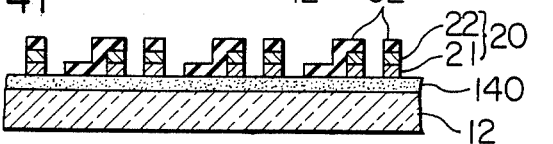

Then, a second photoresist pattern 92 having the same shape as the transparent conductive film 14 shown in FIG. 2c is formed on the nickel pattern 22 and In$_2$O$_3$ film 140, as shown in FIG. 4f.

Figure 4G:
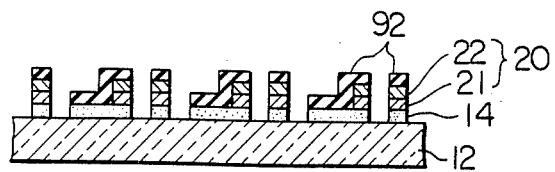

The In$_2$O$_3$ film 140 is chemically etched by using the second photoresist pattern 92 as a mask. This etching is carried out at an etching rate of 42 nm/sec using a 47 percent HBr solution as an etching solution at 35° C., or at an etching rate of 60 nm/sec using a 57 percent HI solution as an etching solution at 35° C. Thus, an In$_2$O$_3$ pattern 14 having the same shape as the transparent conductive film 14 shown in FIG. 2c is obtained, as shown in FIG. 4g. These etching solutions produce only a little undercut in the In$_2$O$_3$ pattern 14, and can selectively etch the In$_2$O$_3$ film 140 without etching the nickel pattern 22 and chromium pattern 21. When the HBr solution is employed, the fabricating cost of the display panel is reduced, since the HBr solution is inexpensive as compared with the HI solution.

Figure 2D:
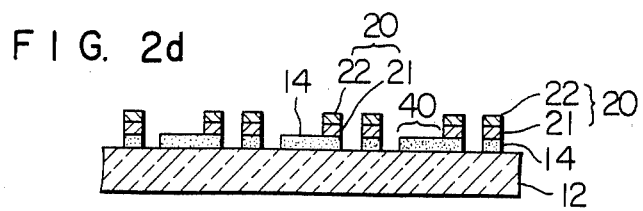
FIG. 2d is a sectional view taken along the line IID—IID in FIG. 2c.
Figure 2E:
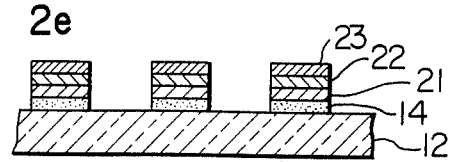
FIG. 2e is a sectional view taken along the line IIE—IIE in FIG. 2c.
Figure 4H:
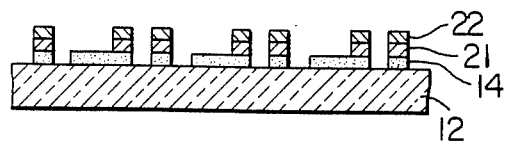

Next, the second photoresist pattern 92 is peeled off by a photoresist removing agent belonging to the xylene group, or the like. Thus, a desired pattern such as shown in FIGS. 2c and 2d is obtained, as shown in FIG. 4h.

The present inventors have confirmed that the two-layer film of Cr-Ni thus obtained adheres well to the substrate 12 and In$_2$O$_3$ pattern 14 since the lower layer of the two-layer film is formed of the chromium pattern 21, and that the connecting terminal portion of the two-layer film is readily soldered since the upper layer of the two-layer film is formed of the nickel pattern 22.

Further, it has been found that the chromium pattern 21 in the two-layer film of Cr-Ni is required to have a thickness of more than 250 Å to adhere well to the substrate 12 and In$_2$O$_3$ pattern 14. It has been also found that when the thickness of the chromium film 210 is less than 250 Å, the chromium film 210 is deposited in such a manner that a number of islands are separately arranged, and therefore the two-layer film of Cr-Ni does not adhere to the substrate 12 and In$_2$O$_3$ pattern 14. However, the thickness of the chromium film 210 should not be made larger than a necessary thickness, since chromium is high in resistivity. Thus, the most preferable thickness of the chromium pattern 21 lies in a range between 250 to 1000 Å. Further, it has been found that the nickel pattern 22 for reducing the resistance of the two-layer film of Cr-Ni has a sheet resistivity of 0.8 Ω/sq at a thickness of about 1000 Å, and the nickel pattern 22 having a thickness of about 1000 Å can exhibit a satisfactory electric characteristic at a fine metal contact member having a width of about 10 μm.

In the present embodiment, the chromium film 210 and nickel film 220 for forming the metal contact member are successively etched by using the first photoresist pattern 91 as a mask, and therefore the number of broken portions in the metal contact member and the number of fabricating steps are small as compared with conventional display panels.

Further, the chromium film 210 and nickel film 220 for forming the metal contact member and the In$_2$O$_3$ film 140 for forming the transparent conductive film are separately etched by using different photoresist patterns 91 and 92 as respective masks. Accordingly, even when a defect is present in the first photoresist pattern 91 and therefore part of each of the chromium pattern 21 and nickel pattern 22 is broken, there is little danger of an electrode portion which includes the defective metal contact member and the In$_2$O$_3$ pattern 14, being separated into two parts since the In$_2$O$_3$ film 140 is etched by using the second photoresist pattern 92 as a mask.

As is evident from the above-mentioned description, the two-layer film of Cr-Ni used as the metal contact member of a matrix liquid crystal display panel adheres well to the substrate and the transparent conductive film, is readily soldered, can be etched with high accuracy through a photoetching technique, and therefore is reliable.

EMBODIMENT 2

An In$_2$O$_3$ pattern 14 for forming the transparent conductive film and a two-layer pattern 20 of Cr-Ni for forming the metal contact member are formed in the same manner as EMBODIMENT 1, so as to have a predetermined shape.

Both ends of an electrode in a liquid crystal display panel are usually used as connecting terminals to be connected to external circuits. The present embodiment aims at improving the reliability of soldering at a connecting terminal portion. In order to improve the reliability of soldering, it is required to make large an area getting wet with solder at the connecting terminal portion. It has been found that the reliability of soldering can be improved by forming a copper film 23, which gets wet well with solder as compared with the nickel pattern 22, on the nickel pattern 22 at the connecting terminal portion. In more detail, in both of the case where the copper film 23 was not formed on the connecting terminal portion of the Cr-Ni pattern 20 and the case where the copper film 23 was formed on the connecting terminal portion, it was measured how much the connecting terminal portion got wet with solder, and it was found that 80 percent of the connecting terminal portion having no copper film got wet with solder and 100 percent of the connecting terminal portion having the copper film 23 got wet with solder. That is, the Cr-Ni pattern 20 can get wet well with solder by forming the copper film 23 on the pattern 20. The copper film 23 can be formed only on the connecting terminal portion of the two-layer pattern 20 of Cr-Ni by various methods such as an evaporation method and a sputtering method. However, it is evident that chemical plating is most suited to form the copper film 23 on the connecting terminal portion. In more detail, when the copper pattern 23 is formed by the evaporation method or the sputtering method, evaporation or sputtering has to be carried out while using a mask, or the copper film 23 which has been formed by one of these methods, must be etched through a photoresist technique. That is, these processes for forming the copper pattern 23 are complicated. On the other hand, in the case where the copper pattern 23 is formed by chemical plating, a copper layer having a desired thickness can be obtained by dipping only the connecting terminal portion of the two-layer pattern 20 of Cr-Ni into a plating bath. That is, the process for forming the copper pattern 23 is very simple.

When a liquid crystal display panel is fabricated, a liquid crystal material is introduced into a gap between a pair of substrates which have been provided with electrodes. Accordingly, when the peripheral portion of the gap filled with the liquid crystal material has been sealed, only the connecting terminal portion of the Cr-Ni pattern 20 is exposed at end portions of the substrates. The copper pattern 23 may be formed by chemical plating in this state. Such a method of forming the copper pattern 23 is very advantageous in simplifying the fabricating process of the display panel, as compared with the case where the copper pattern 23 is formed by the evaporation or sputtering method.

EMBODIMENT 3

In this embodiment, the metal contact member is formed of a two-layer film including an NiCr layer and an Au layer, and a copper film is formed on the connecting terminal portion of the metal contact member. Such a two-layer film has advantages that the NiCr layer adheres well to the substrate and In$_2$O$_3$ film, and the Au layer enhances the chemical stability of the two-layer film and is small in electric resistance. However, when the connecting terminal portion of the two-layer film and an electric circuit are connected with solder, the Au layer is resolved by solder and therefore a poor connection is made. Accordingly, in the present embodiment, only the connecting terminal portion of the NiCrAu film is plated with copper, as in EMBODIMENT 2, to prevent the Au layer from being resolved by solder. Thus, a column electrode pattern is obtained which can be connected perfectly with an electric circuit.

In the NiCr-Au film of the present embodiment, the thickness of the NiCr layer is made greater than or equal to 500 Å, and the thickness of the Au layer is not required to be large but is put in a range from 500 to 1000 Å.

EMBODIMENT 4

In this embodiment, a two-layer film including a Cr layer and an Au layer is used to form the metal contact member, and a copper film is formed only on the connecting terminal portion of the metal contact member. This two-layer film has advantages that the Cr layer adheres well to the substrate and In$_2$O$_3$ film, and the Au layer improves the chemical stability of the two-layer film and is small in electric resistance. Further, the copper film formed on the connecting terminal portion gets wet well with solder, and thus the reliability of soldering is enhanced.

Figure 5:
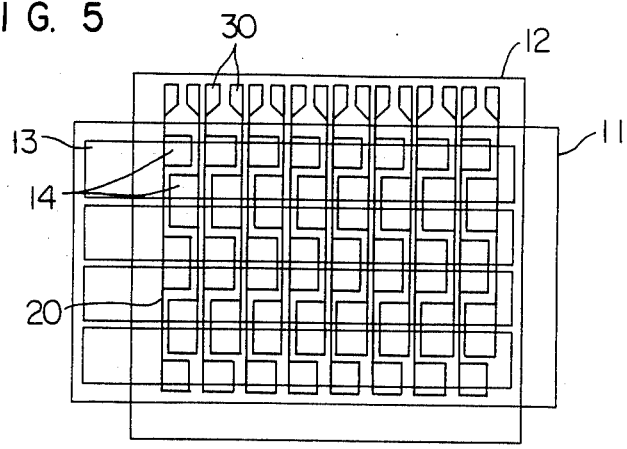
FIG. 5 is a plan view showing an embodiment of an inverted double matrix liquid crystal display panel, to which the present invention is applicable.
Figure 6:
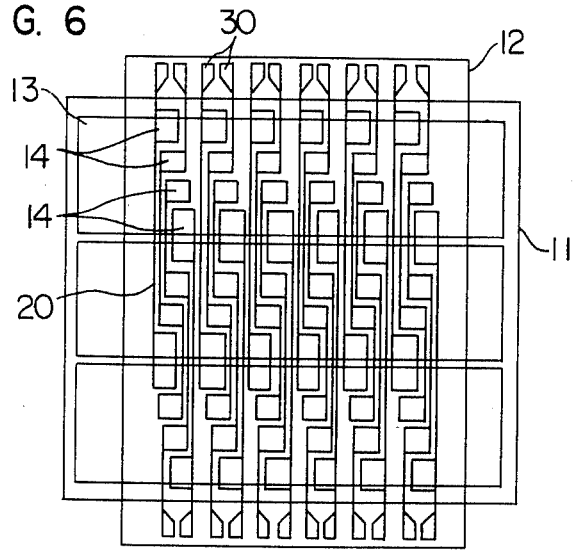
FIG. 6 is a plan view showing an embodiment of an inverted quadruple matrix liquid crystal display panel, to which the present invention is applicable.

The present invention is not limited to such a double matrix display panel as shown in FIG. 2a, but is applicable to various multi-matrix display panels such as an inverted double matrix display panel shown in FIG. 5 and an inverted quadruple matrix display panel shown in FIG. 6. Incidentally, like reference numerals in FIGS. 2a, 5 and 6 designate like or equivalent parts.

Further, the present invention is not limited to a display panel using a liquid crystal material, but is applicable to display devices using other display substances such as an electroluminescence material and a plasma display material.

We claim:

1. A display panel comprising:
   a pair of substrates arranged face to face with each other with a predetermined gap therebetween;
   at least a pair of electrodes each provided on a corresponding one of facing surfaces of said substrates, at least one of said electrodes being made up of a multiplicity of picture element electrodes which are juxtaposed to each other and formed of a transparent conductive film, and a transparent conductive film and a contact metal member for substantially making an electrical connection of a plurality of ones of said picture element electrodes, said contact metal member being made up of a first layer formed on said transparent conductive film forming said electrical connection and a second layer, said first layer being made of chromium or a chromium alloy, said second layer being formed on said first layer and made of nickel or gold; and
   a display substance provided between said electrodes.

2. A display panel according to claim 1, wherein at least one of said electrodes is made up of a multiplicity of picture element electrodes which are regularly juxtaposed and formed of a transparent conductive film, and at least two contact metal members each for substantially making an electrical connection of a plurality of ones of said picture element electrodes.

3. A display panel according to claims 1 or 2 wherein a third layer made of copper is formed on said second layer of said contact metal member at a connecting terminal portion of said contact metal member for connecting an external circuit to said contact metal member.

4. A display panel according to claims 1 or 2 wherein when said first layer is made of chromium, the thickness of said first layer lies within a range from 250 to 1000 Å.

5. A display panel according to claim 1 wherein said display substance is a liquid crystal material.

6. A display panel according to claim 1, wherein a third layer made of copper is formed on said second layer of said contact metal member at a connecting terminal portion of said contact metal member for connecting an external circuit to said contact metal member.

7. A display panel according to claim 1, wherein when said first layer is made of chromium, the thickness of said first layer lies within a range from 250 to 1000 Å.

8. A display panel according to claim 1, wherein at least one other of said electrodes is made up of a multiplicity of picture element electrodes which are juxtaposed to each other and formed of a transparent conductive film, and a contact metal member for substantially making an electrical connection of a plurality of ones of said picture element electrodes of said at least one other of said electrodes, said contact metal member being made up of a first layer and a second layer, said first layer being made of chromium or a chromium alloy, and said second layer being formed on said first layer and being made of nickel or gold.

9. A display panel according to claim 3, wherein said display substance is a liquid crystal material.

10. A display panel according to claim 4, wherein said display substance is a liquid crystal material.

11. A display panel according to claim 3, wherein said first layer is made of chromium, the thickness of said first layer lies with a range from 250 to 1000 Å.

* * * * *